(12) United States Patent
Sommervogel

(10) Patent No.: US 10,345,365 B2
(45) Date of Patent: Jul. 9, 2019

(54) REFLECTOMETRY METHOD AND DEVICE FOR DIAGNOSING CABLES IN USE

(71) Applicant: WIN MS, Orsay (FR)

(72) Inventor: Laurent Sommervogel, Jouy-en-Josas (FR)

(73) Assignee: WIN MS, Orsay (FR)

( * ) Notice: Subject to any disclaimer, the term of this patent is extended or adjusted under 35 U.S.C. 154(b) by 64 days.

(21) Appl. No.: 15/578,211

(22) PCT Filed: May 17, 2016

(86) PCT No.: PCT/EP2016/061004
§ 371 (c)(1),
(2) Date: Nov. 29, 2017

(87) PCT Pub. No.: WO2016/192980
PCT Pub. Date: Dec. 8, 2016

(65) Prior Publication Data
US 2018/0149693 A1    May 31, 2018

(30) Foreign Application Priority Data

Jun. 4, 2015 (FR) ...................... 15 55080

(51) Int. Cl.
*G01R 31/11* (2006.01)
*H04B 3/46* (2015.01)

(52) U.S. Cl.
CPC .............. *G01R 31/11* (2013.01); *H04B 3/46* (2013.01)

(58) Field of Classification Search
CPC ......... G01R 31/008; H04B 3/54; H04B 10/14
See application file for complete search history.

(56) References Cited

U.S. PATENT DOCUMENTS

| 2011/0181295 | A1* | 7/2011 | Haugen | G01R 31/024 324/543 |
| 2011/0307197 | A1* | 12/2011 | Lelong | G01R 31/11 702/58 |
| 2014/0222356 | A1* | 8/2014 | Incarbone | G01R 31/11 702/59 |

FOREIGN PATENT DOCUMENTS

| FR | 2 931 323 A1 | 11/2009 |
| WO | 2009/087045 A1 | 7/2009 |

OTHER PUBLICATIONS

Adrien Lelong, "Methodes de diagnostic filaire embarque pour des reseaux complexes," Thesis for l'Universite des Sciences et Technologies de Lille, Dec. 9, 2010, pp. 1-167, XP055047458.

(Continued)

*Primary Examiner* — Jermele M Hollington
*Assistant Examiner* — Alvaro E Fortich
(74) *Attorney, Agent, or Firm* — Baker & Hostetler LLP

(57) ABSTRACT

A complete injection signal is provided having a digital spectrum formed from components weighted by a set of coefficients, in a preliminary step, the coefficients of the components included within a frequency band are attenuated resulting in an incomplete digital spectrum being obtained; in a next step, the analog signal composed from the incomplete digital spectrum is injected into the electrical line; in a next step, the echo corresponding to the injected signal is measured; in a next step, the digital spectrum of the echo is calculated; in a next step, the digital spectrum of the echo of the complete analog signal if the latter had been injected is estimated, the $k^{th}$ component of the estimated complete digital spectrum being equal to the $k^{th}$ component of the digital spectrum of the echo received multiplied by the ratio between the $k^{th}$ component of the digital spectrum of the complete injection signal over the $k^{th}$ component of the incomplete digital spectrum; in a next step, the measurement of the reflectogram of the line is obtained based on the estimated complete digital spectrum.

12 Claims, 4 Drawing Sheets

(56) References Cited

OTHER PUBLICATIONS

W. B. Hassen et al., "On-line diagnosis using Orthogonal Multi-Tone Time Domain Reflectometry in a lossy cable," IEEE 2013 10th International Multi-Conference on Systems, Signals & Devices (SSD), Mar. 18, 2013, pp. 1-6, XP032439823.
Suketu Naik et al., "Multicarrier Reflectometry," IEEE Sensors Journal, vol. 6, No. 3, Jun. 2006, pp. 812-818.

\* cited by examiner

REFLECTOMETRY METHOD AND DEVICE FOR DIAGNOSING CABLES IN USE

CROSS-REFERENCE TO RELATED APPLICATIONS

This application is a National Stage of International patent application PCT/EP2016/061004, filed on May 17, 2016, which claims priority to foreign French patent application No. FR 1555080, filed on Jun. 4, 2015, the disclosures of which are incorporated by reference in their entirety.

FIELD OF THE INVENTION

The present invention relates to a method and a reflectometer device, notably of the multicarrier type, for diagnosing cables in use.

BACKGROUND

The diagnosis of a line or of an electrical cable by reflectometry is a well known method consisting in the injection of a wideband signal into the line and in the detection of the echoes, in order to track the variations of characteristic impedance of the line corresponding to irregularities, notably defects such as for example open circuits or short-circuits.

In its simplest version, the probe signal is a pulse whose duration depends on the bandwidth and of the length of the cable to be diagnosed.

Amongst the known reflectometry methods, the multicarrier reflectometry method known as MCTDR (Multi-Carrier Time-Domain Reflectometry) offers the advantage of being able to precisely control the spectrum of the injected signal and thus to be able to respond to imposed constraints on electromagnetic compatibility (EMC).

Henceforth, the following conventions will be adopted:
* $*$ denotes the convolution product
* $\star$ denotes the cross-correlation (inter-correlation)
* h denotes the pulse response of the cable
* ĥ denotes the estimated response of the cable: the reflectogram
* x denotes the injected signal
* y denotes the reflected signal The notations in capitals denote the Fourier transforms of those in lower case
* F{ } denotes the Fourier transform operation
* $F^{-1}${ } denotes the inverse Fourier transform operation The injected signal x and reflected signal y are linked via the following equation: y=x*h.

The aim of a reflectometry measurement is notably to measure the signal h, if possible with maximum precision.

h may be considered as a parsimonious signal, in other words it only contains peaks at the location of the irregularities on the cable.

In an ideal simplified case for a cable whose end is in open circuit, the difference in position between the first two peaks of h allows the knowledge of the length of the cable to be deduced.

When it is desired to monitor or diagnose a cable in use, at least one non-invasive measurement needs to be carried out, if it cannot be non-intrusive. Two conditions must then be met:
a suitable coupling means needs to be found, notably in terms of impedance;
signals having frequency components covering bands of frequencies already used in the target application must not be injected. In other words, any interference between the signals associated with the operation of the target application and the signals associated with the reflectometry is to be avoided, this leading to various constraints for the EMC, spectral occupation and robustness to noise.

The second condition notably allows the following double guarantee to be obtained:
the diagnostic signals do not interfere with those of the application in use, in transmission;
the signals of the application do not degrade the quality of the diagnosis, in terms of susceptibility.

By way of example:
for the diagnosis of an antenna cable for the application of an FM radio reception, the frequency band 88-108 MHz must be avoided for the diagnostic signal;
for the diagnosis of the CAN bus of a vehicle, the band 0.1-2 MHz must similarly be avoided.

The MCTDR technique, notably described in the patent application FR 2 931 323 A1, allows a probe signal to be constructed that meets a given spectral range requirement. The solution described can manage any given number of frequency bands with a variable attenuation coefficient within each band, which may go as far as total extinction.

However, in the solution described, an important technical limitation needs to be confronted. This is because, the more frequency bands are attenuated or suppressed, the poorer the abundance of the frequency content on the measurement of the reflected signal y, and the more the quality of the diagnosis is degraded.

In particular, if an ideal pulse were considered, represented by a Dirac function x=δ, for diagnosing the cable, h=y would be obtained. However, MCTDR is a pulse compression technique. In other words, the energy is not concentrated over a very short time period but distributed over the whole duration of the signal. It may be demonstrated mathematically, in this case, that: $\hat{h}=R_{xx}*h$, with $R_{xx}=x\star x$, this auto correlation being called the pattern. The ideal case $R_{xx}=\delta$ is only possible if x contains all the frequencies. However, the more of the frequency components that are removed, the less the pattern resembles a pulse.

There exist several diagnostic techniques that do not interfere with a target application.

The reflectometry known as SSTDR (Spread Spectrum Time Domain Reflectometry) is a variant of STDR (Sequence Time Domain Reflectometry) reflectometry. STDR is also a pulse-compression technique. With this technique, instead of injecting a pulse, a binary sequence of square pulses, composed of +1 and −1, is injected into the cable in such a manner that the auto-correlation of the sequence is close to a pulse.

STDR does not allow the EMC constraints to be overcome but SSTDR provides an answer to this. For this purpose, the STDR sequence is modulated by a sinusoidal carrier of frequency $f_0$. It is therefore, in fact, a modulated STDR sequence. In order to meet the operational constraints, $f_0$ is chosen so as to move the modulated signal away from the forbidden bands.

A reflectometry method described in the document FR 2 931 323 A1 is an iterative method aiming to calculate h starting from the estimated pulse response ĥ. This is a post-processing algorithm which can take as input a reflectometry measurement made with a signal probe of the MCTDR type. It therefore benefits from being innocuous from the EMC point of view.

Multicarrier reflectometry, or MCR, uses the same waveforms as MCTDR, with a weighted sum of sinusoidal waves. For this reason, it provides the same quality of response to the EMC problems.

The processing of the reflected signal is however very different, since it uses an optimization algorithm (of the least-squares type) directly applied in the frequency domain in order to adapt the coefficients ($\alpha$; $\tau$) of a model of simplified parsimonious pulse response for the cable:

$$\hat{h}(t) = \sum_i \alpha_i \delta(t - 2i\tau)$$

This processing offers the advantage of being able to be carried out for a limited number of excitation frequencies.

The MCR technique is notably described in the article "Multicarrier Reflectometry", IEEE SENSORS JOURNAL, VOL. 6, No. 3, June 2006.

One problem to be solved is notably to allow the flexibility of the injection methods with a controlled spectral width, such as notably MCTDR, while at the same time overcoming the problems of denaturation of the pattern which introduce a bias into the result of the diagnosis.

The reflectometry methods previously described do not solve this problem or solve it insufficiently.

SSTDR reflectometry seems to address this problem, but it does however have several drawbacks:

The modulation system around the frequency $f_0$ introduces a complexity of implementation and additional costs.

It is complicated to change $f_0$ "on the fly", which does not allow a dynamic reconfiguration of the diagnostic system.

In certain applications, it may even be difficult to find an available frequency $f_0$; it should be noted that the bandwidth of the cable is a limiting factor and $f_0$ cannot be chosen to be arbitrarily high.

Similarly, the algorithm described in the document FR 2 931 323 A1 for post-processing could be suitable. However, its robustness is compromised when peaks are located too close to one another in the pulse response h of the cable. Furthermore, it begins to converge in an erroneous manner when more than about one sixth (⅙) of the useful band of the test signal has been eliminated.

As far as the MCR method is concerned, although it appears to be insensitive to the cancelling of its coefficients, it suffers notably from the following prohibitive deficiencies:

Its use is limited to point-to-point cables.

It leads to an imprecision in localization which can reach 3% to 5% of the length of a cable.

SUMMARY OF THE INVENTION

One aim of the invention is notably to overcome the aforementioned drawbacks. For this purpose, one subject of the invention is a method for diagnosing at least one electrical line by reflectometry measurements, said electrical line being in use within a given frequency band, the diagnosis being carried out by analysis of the reflectogram of said line, said method notably comprising the following steps:

A complete injection signal having a digital spectrum formed from components weighted by a set of coefficients, in a preliminary step on the coefficients of the components included within said frequency band are attenuated resulting in an incomplete digital spectrum being obtained.

In a next step, the analog signal composed from said incomplete digital spectrum is injected into the electrical line (10).

In a next step, the echo corresponding to said injected signal is recovered by sampling of measurements of said echo.

In a next step, the digital spectrum ($Y_{cancel}$) of said echo is calculated.

In a next step, the digital spectrum ($\hat{Y}_{full}$) of the echo of the complete analog signal if the latter had been injected is estimated, the $k^{th}$ component ($\hat{Y}_{fullk}$) of the estimated complete digital spectrum being equal to the $k^{th}$ component ($Y_{cancelk}$) of the digital spectrum of the echo received multiplied by the ratio (between the $k^{th}$ component ($X_{fullk}$) of the digital spectrum of the complete injection signal over the $k^{th}$ component ($X_{cancelk}$) of the incomplete digital spectrum.

In a next step, the measurement of the reflectogram of said line is obtained from the estimated complete digital spectrum ($\hat{Y}_{full}$).

Since the injected signal is calculated over N points, the echo is for example sampled over NP measurement points, the digital spectrum ($Y_{cancel}$) of the echo being calculated over said sampled NP points, P being strictly greater than 2, where P may be greater than or equal to 10.

The ratios ($\xi_k$) are for example calculated over N points, the N calculated ratios being re-used P times.

In the case where the injected signal is not of the MCTDR type, said ratio is for example defined according to the following relationship:

$$\xi = \lim_{\varepsilon \to 0} \frac{X_{full} X_{cancel}^*}{|X_{cancel}|^2 + \varepsilon}$$

$X_{full}$ and $X_{cancel}$ being, respectively, the digital spectrum of the complete injection signal and the digital spectrum of the injected signal.

Another subject of the invention is a reflectometer device, designed to be used for diagnosing a line in use within a given frequency band, said device comprising at least:

a parameterization block for configuring the parameters of the signal to be injected into said line, a complete injection signal having a digital spectrum formed of components weighted by a set of coefficients, the coefficients of the components included within said frequency band being attenuated in order to obtain an incomplete digital spectrum;

a block synthesizing the signal to be injected, in the digital domain, starting from the incomplete digital spectrum;

a digital-analog converter converting the synthesized digital signal into an analog signal;

means for coupling to said line allowing said analog signal to be injected into said line;

an analog-digital converter converting the echo corresponding to the injected signal;

processing means:

carrying out sampled measurements of said echo and storing the samples;

calculating the digital spectrum ($Y_{cancel}$) of said echo;

estimating the digital spectrum ($\hat{Y}_{full}$) of the echo of the complete analog signal if the latter had been injected, the $k^{th}$ component ($\hat{Y}_{fullk}$) of the estimated complete digital spectrum being equal to the $k^{th}$ component ($Y_{cancelk}$) of the digital spectrum of the echo received multiplied by the ratio ($\xi_k$) between the $k^{th}$ component ($X_{fullk}$) of the digital spectrum of the complete injection signal over the $k^{th}$ component ($X_{cancelk}$) of the incomplete digital spectrum;

obtaining the reflectogram of said line based on the estimated complete digital spectrum ($\hat{Y}_{full}$).

BRIEF DESCRIPTION OF THE DRAWINGS

Other features and advantages of the invention will become apparent with the aid of the description that follows, presented with regard to the appended drawings which show.

DETAILED DESCRIPTION

Figure 1:
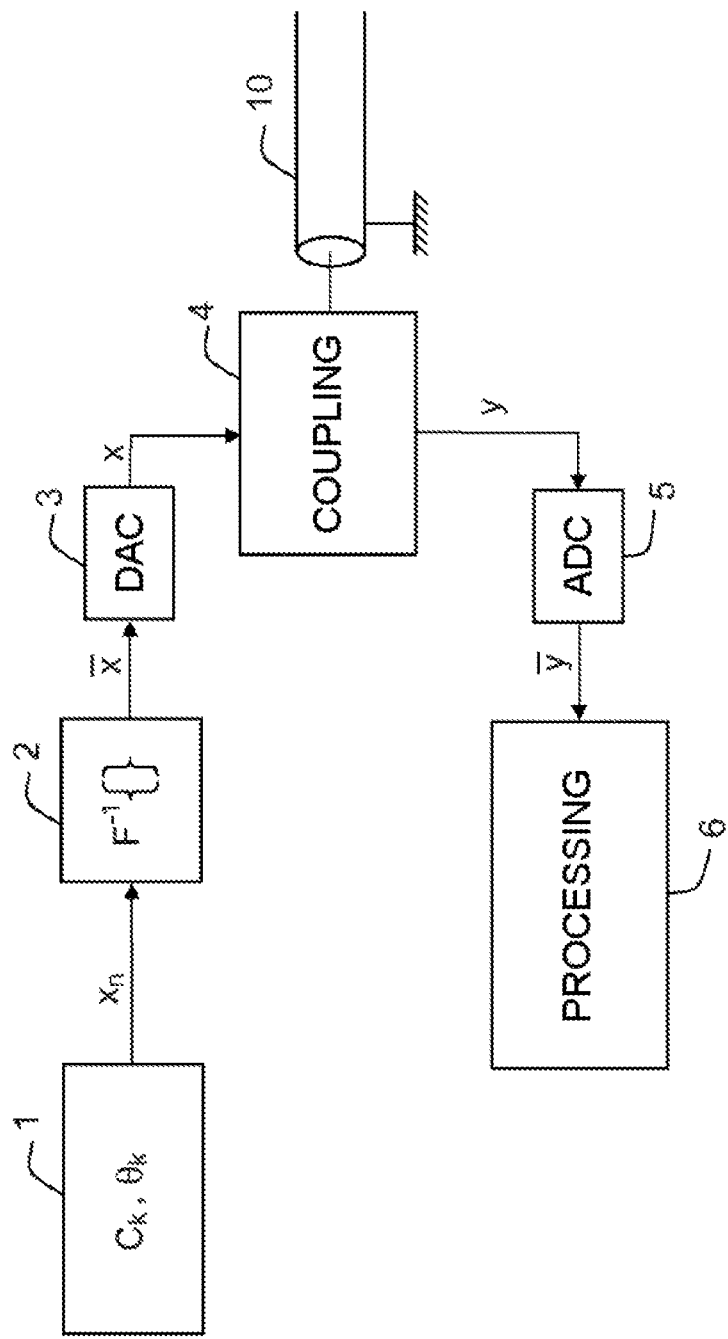
FIG. 1, one example of reflectometer device coupled to a cable, designed to implement the method according to the invention.

FIG. 1 shows one example of architecture of a multicarrier reflectometer MCTDR device, composed of various blocks, designed to implement the invention.

In this exemplary embodiment, the device comprises a first block 1 for configuring the parameters of the test signal x to be injected. This analog signal is obtained starting from a sampled signal parameterized in this first block. Since parameters of this signal are configured over N samples, a sample $x_n$ is expressed according to the following relationship:

$$x_n = 2 \sum_{k=0}^{N/2-1} c_k \cos\left(2\pi \frac{nk}{N} + \theta_k\right) \quad (1)$$

The samples $x_n$ are sampled according to a sampling period Te.

The parameterization block is followed by a block 2 which synthesizes the test signal by inverse Fourier transform. At the output of this block 2, the digitized test signal) $\dot{x}$ is therefore obtained. A digital-analog converter 3 converts this signal into the analog domain in order to obtain the signal to be injected x.

This MCTDR signal, x, is simply the sum of sinusoids weighted by a set of coefficients $c_k$, where $\theta_k$ is the phase of the $k^{th}$ sinusoid.

The signal x is injected into the cable 10 to be diagnosed via coupling means 4. These same means allow the reflected signal y to be received. The latter is digitally converted by an analog-digital converter 5, then it is analyzed by processing means 6 in order to deduce from this the estimated pulse response $\hat{h}$ of the cable 10.

It may be shown that the module of the analog spectrum X(f) of the injected MCTDR signal is given by the following relationship (2), f being the frequency variable:

$$|X(f)| = f_{max} \sum_{k=0}^{N/2-1} c_k \sum_{n=-\infty}^{+\infty} \left[\delta\left(f - f_{max}\left(\frac{k}{N} + n\right)\right) + \delta\left(f + f_{max}\left(\frac{k}{N} - n\right)\right)\right] \quad (2)$$

$f_{max}$ being the maximum frequency composing the MCTDR signal;

$\delta$ being the Dirac function.

This relationship shows that when a coefficient $c_k$ is cancelled or attenuated, in particular $$f = \frac{k f_{max}}{N}$$

is impacted.

By way of example, if N=256 and $f_{max}$=200 MHz, and if it is desired to cancel the MCTDR signal in the 10 to 20 MHz band:

The following are calculated:

$$k_1 = 256 \times \frac{10}{200} \approx 13 \text{ and } k_2 = 256 \times \frac{20}{200} \approx 26$$

The following parameters are set: $c_{13}=c_{14}=\ldots=c_{26}=0$.

The MCTDR signal is therefore significantly denatured by the cancelling or the very strong attenuation of these coefficients, which introduces biases into the analysis of the pulse response and hence into the diagnosis of the cable.

One aim of the invention is notably to overcome this problem. For this purpose, the invention advantageously uses the fact that the $k^{th}$ component, $X_k$, of the digital spectrum of the injected MCTDR signal may be written according to the following relationship (3):

$$X_k = c_k e^{j\left(\theta_k - k\pi \frac{P-1}{NP}\right)} \frac{\sin\left(\frac{k\pi}{N}\right)}{\sin\left(\frac{k\pi}{NP}\right)} \quad (3)$$

where P represents the ratio between the sampling frequency 1/Te and the maximum frequency $f_{max}$ of the MCTDR signal. In order to comply with the Shannon condition, P must be chosen ≥2, but an over-sampling may be carried out by taking for example P equal to 10 or to 20.

In the following part of the description, $X_{full}$ will denote the digital spectrum for which none of the coefficients $c_k$ is attenuated and $X_{cancel}$ the spectrum that must be used for complying with the EMC constraints imposed in the target application. $X_{cancel}$ corresponds to the case where coefficients $c_k$ are attenuated. In the invention, the coefficients $c_k$ are not cancelled but only very attenuated. They may have a very small value, for example of the order of 0.01 but remain non-zero. A non-attenuated coefficient $c_k$ is equal to 1.

Using the previous notations, the following may be written:

$X_{full}=F\{x_{full}\}$ and $X_{cancel}=\{x_{cancel}\}$, $F\{\}$ being the Fourier transform, as previously indicated.

$x_{full}$ and $X_{cancel}$ are respectively the signals with all the coefficients $c_k$ non-attenuated and with coefficients $c_k$ attenuated.

$y_{full}$ and $y_{cancel}$ will also be denoted as the respective echoes of the signals $x_{full}$ and $x_{cancel}$.

Similarly, the following are denoted:

$$Y_{full}=F\{y_{full}\} \text{ and } Y_{cancel}=F\{y_{cancel}\}$$

Figure 3:
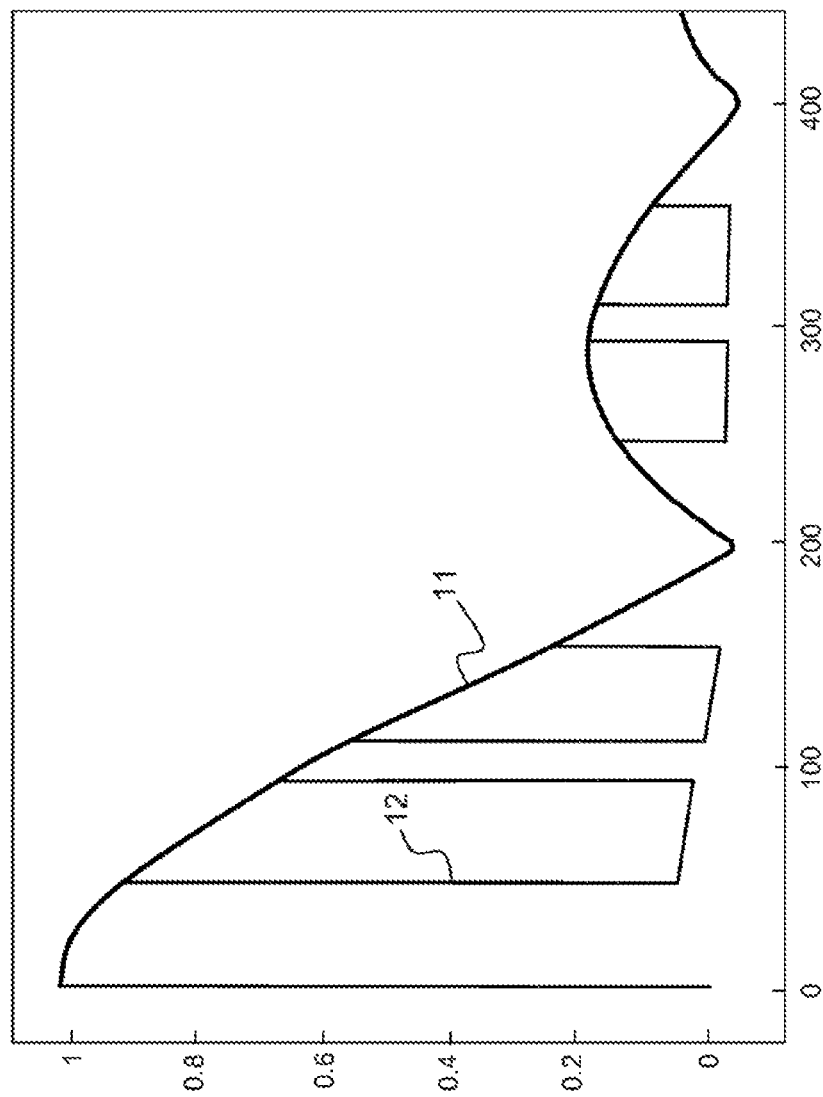
FIG. 3, one example of digital spectrum of a full injection signal and of spectrum of an attenuated signal.

One example of digital spectrum $X_{full}$ and one example of digital spectrum $X_{cancel}$ are illustrated in FIG. 3, respectively by a first curve 11 and a second curve 12.

The invention allows an estimation to be obtained that is as close as possible to the echo $y_{full}$ corresponding to the full MCDTR signal $x_{full}$, without attenuations, starting from the echo signal $y_{cancel}$ obtained from the incomplete MCTDR signal $x_{cancel}$.

$Y_{full}$ and $Y_{cancel}$ verify both of the following two relationships (4):

$$\begin{cases} Y_{full} = X_{full} \cdot H \\ Y_{cancel} = X_{cancel} \cdot H \end{cases} \quad (4)$$

where $H=F\{h\}$, h being the pulse response of the cable. In order to obtain H and hence $h=F^{-1}\{H\}$:

having injected the signal $x_{cancel}$;
measured the corresponding echo $y_{cancel}$;
then calculated $X_{full}=F\{x_{full}\}$, $X_{cancel}=F\{x_{cancel}\}$, and $Y_{cancel}=F\{y_{cancel}\}$ one solution could be to estimate $Y_{full}$ according to the following calculation:

$$\hat{Y}_{full} = \frac{X_{full}}{X_{cancel}} \times Y_{cancel},$$

$\hat{Y}_{full}$ being the estimated value of $Y_{full}$.

Unfortunately, this solution poses implementation problems since $X_{cancel}$ may become zero owing notably to the coefficients $c_k$ but also systematically becomes zero at every N points because of the term sin $$\left(\frac{k\pi}{N}\right).$$

If the following are denoted:

$(c_k;\theta_k)$ the coefficient and phase pairs associated with $X_{cancel}$;

$(1; \varphi_k)$ the coefficient and phase pairs associated with $X_{full}$, the coefficients $c_k$ all being equal to 1 for $x_{full}$.

Advantageously, using the relation (3) previously described, the $k^{th}$ component of $X_{full}$ and $X_{cancel}$ may be linked according to the following relationship, k varying from 0 to NP−1:

$$\frac{X_{full_k}}{X_{cancel_k}} = \frac{e^{j(\varphi_k - k\pi\frac{P-1}{NP})}}{c_k e^{j(\theta_k - k\pi\frac{P-1}{NP})}} = \frac{e^{j(\varphi_k - \theta_k)}}{c_k} = \xi_k \quad (5)$$

$\xi_k$, which represents the ratio between the $k^{th}$ component of the digital spectrum $X_{full}$ and the $k^{th}$ component of the digital spectrum $X_{cancel}$, is easily calculable using the values of the pairs $(c_k;\theta_k)$ and $(1; \varphi_k)$ which are known.

The injected signal being calculated over N points, in order to obtain the NP values of $\xi_k$, the signal is calculated over N points and the N calculated values are used P times thus obtaining P periods of N points, giving a periodic nature to the whole set of NP ratios $\xi_k$. In the time domain, this amounts to maintaining the injection of each of the N samples P times, which is precisely the reason for the oversampling.

Thus, the $k^{th}$ component of $\hat{Y}_{full}$ is:

$$\hat{Y}_{full_k} = \xi_k \cdot Y_{cancel_k} \quad (6)$$

N being the number of points or of samples and P being the oversampling factor; at a minimum P=2. In practice P can have a value equal for example to 10 or to 20. In the following, it will be described how the over-sampling may be implemented.

The only condition for the existence of $\hat{Y}_{full_k}$ is that $c_k$ is non-zero, irrespective of the rank k.

Having described the principle of the invention, one example of its implementation can now be described.

Figure 2:
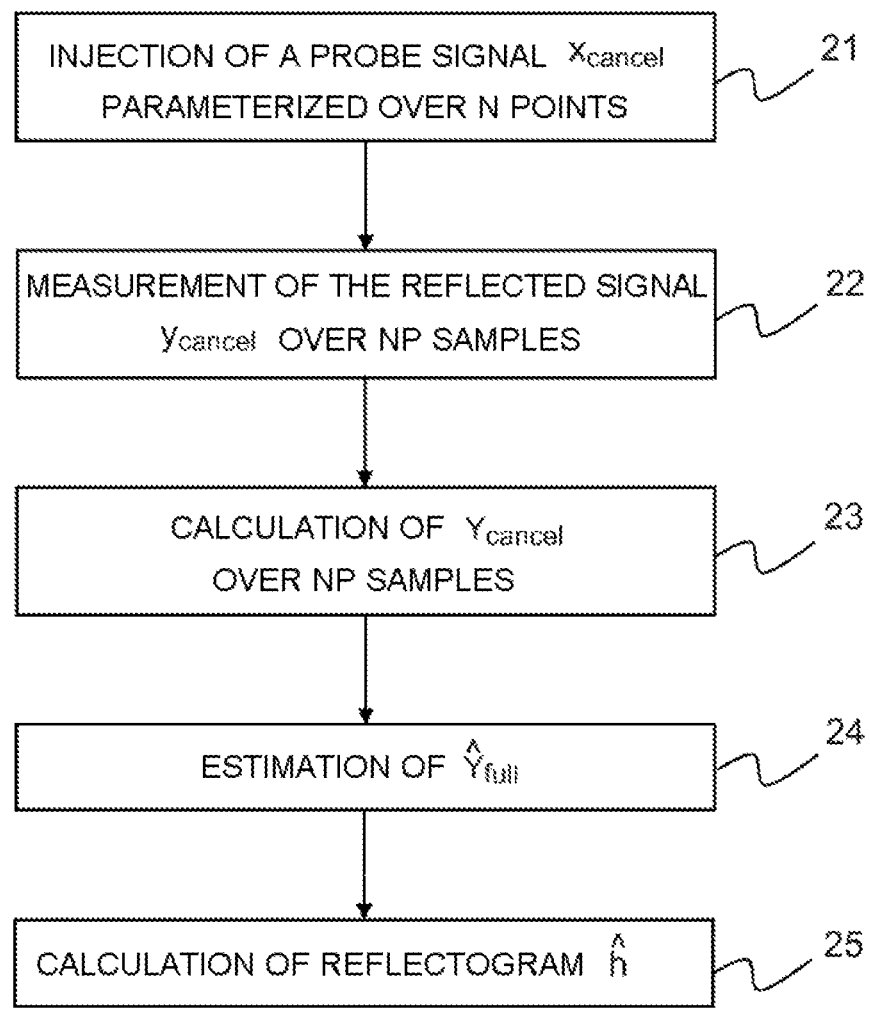
FIG. 2, the possible steps of a method according to the invention.

FIG. 2 therefore illustrates possible steps for the implementation of the method according to the invention. The method may be applied by a device such as described by FIG. 1.

In a first step 21, a probe signal $x_{cancel}$ parameterized over N points is injected. In a preliminary step, depending on the conditions or the constraints to be adhered to, the coefficients $c_k$ that are to be attenuated are calculated by for example assigning the value 0.1 to these attenuated coefficients, and 1 to the other coefficients. This first step 21 may be carried out by means of the components 1, 2, 3 of the device in FIG. 1, allowing the incomplete MCTDR signal $x_{cancel}$ to be obtained, and coupling means 4. The parameterization of the coefficients $c_k$ and of the phases $\theta_k$ in the block 1 may be carried out by means of a suitable interface, furthermore well known.

For practical reasons, notably with regard to the coupling means 4, the injected signal $x_{cancel}$ cannot have a continuous component. It is therefore necessary to have $c_0=0$.

In order to avoid problems of division by 0, for example the following condition is therefore imposed:

$$\forall p \in [0,P-1] \xi_{p \cdot N} = 0 \quad (7)$$

The relationship (7) means notably that the frequency components corresponding to k=0, k=N, k=2N, k=3N, . . . k=(P−1)N of $\xi_k$ are zero. This is notably the case whenever $c_0=0$ is set, owing notably to the periodicity of the samples $\xi_k$ (P periods of N samples).

The signal having been injected into the cable then reflected, in a second step 22, the reflected signal $y_{cancel}$ corresponding to the injected signal $x_{cancel}$ is measured. This measurement is carried out over NP samples.

In practice, the NP measurements are for example carried out by applying N first samplings at the sampling frequency of 1/Te previously described and by repeating P times these N sampling measurements, the N measurements of each series being phase-shifted with respect to the N measurements of the preceding series. In this way, the echo $y_{cancel}$ is always sampled at a clock frequency equal to 1/Te but the P phase-shifted series of measurements in fact allow an equivalent sampling frequency equal to 1/(P·Te) to be obtained. One example of over-sampling that may be applied is notably described in the document WO 2009/087045 A1.

In the exemplary device in FIG. 1, this second step 22 may be implemented by the coupling means 4, the analog-digital converter 5 and by the processing means which receive the digitized echo $y_{cancel}$.

In order to carry out the over-sampled measurements such as described hereinabove, the device comprises for example a clock generating signals at the frequency of 1/Te and a counter. It is also possible to use phase-locked components of the PLL or DLL type. The clock signals generated at 1/Te control the sampling of the digitized echo $y_{cancel}$ at the output of the converter 5, the signal $y_{cancel}$ being sampled at each clock signal generated. The counter counts the clock pulses. When N clock pulses have been counted, the clock signal is phase-shifted before undertaking the next series of N sampled measurements and so on.

The application of such an over-sampling, performing NP sample measurements, advantageously allows the estimation $\hat{Y}_{full}$ to be improved.

In a next step, 23, $Y_{cancel}=F\{y_{cancel}\}$ is calculated based on the NP samples of sampled measurements of $y_{cancel}$, this calculation being carried out by the processing means 6. The Fourier transform used is in fact a discrete Fourier transform.

In a next step, 24, the complete digital spectrum $Y_{full}$ is estimated over NP points with the aid of the ratios $\xi_k$ according to the relationships (5) and (6). This estimation may also be carried out by the processing means 6.

In a next step, 25, the reflectogram of the cable is calculated, which is the pulse response $\hat{h}$ estimated as a function of the estimated value $\hat{Y}_{full}$:

$$\hat{h}=F^{-1}\{X^*_{full}\hat{Y}_{full}\} \qquad (8)$$

The simple product $X^*_{full}\hat{Y}_{full}$ in the frequency domain in fact represents a correlation between $x_{full}$ and $\hat{y}_{full}$ in the time domain.

Figure 4A:
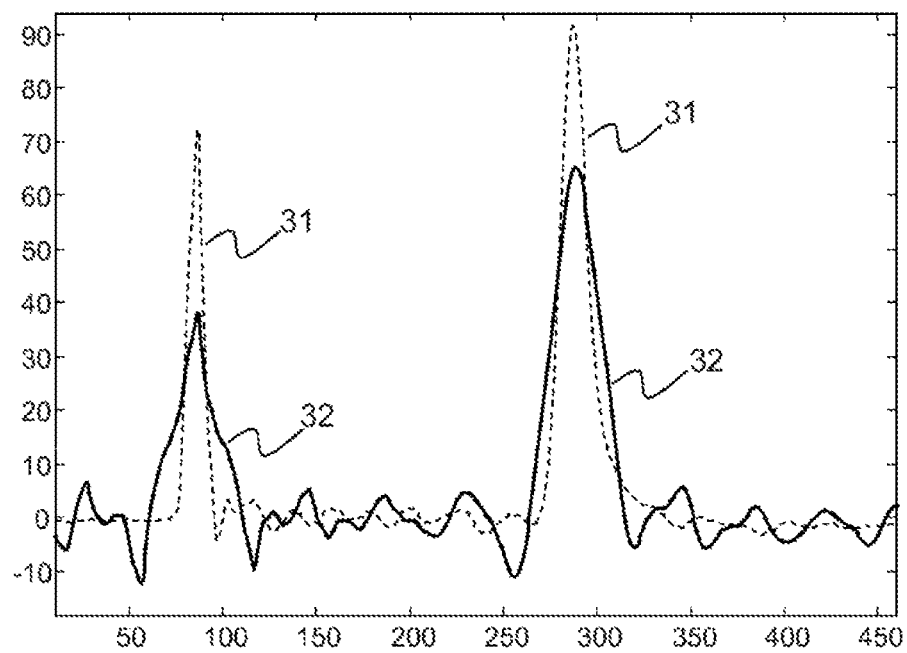
FIGS. 4a and 4b, reflectograms obtained respectively without and with the implementation of the method according to the invention.
Figure 4B:
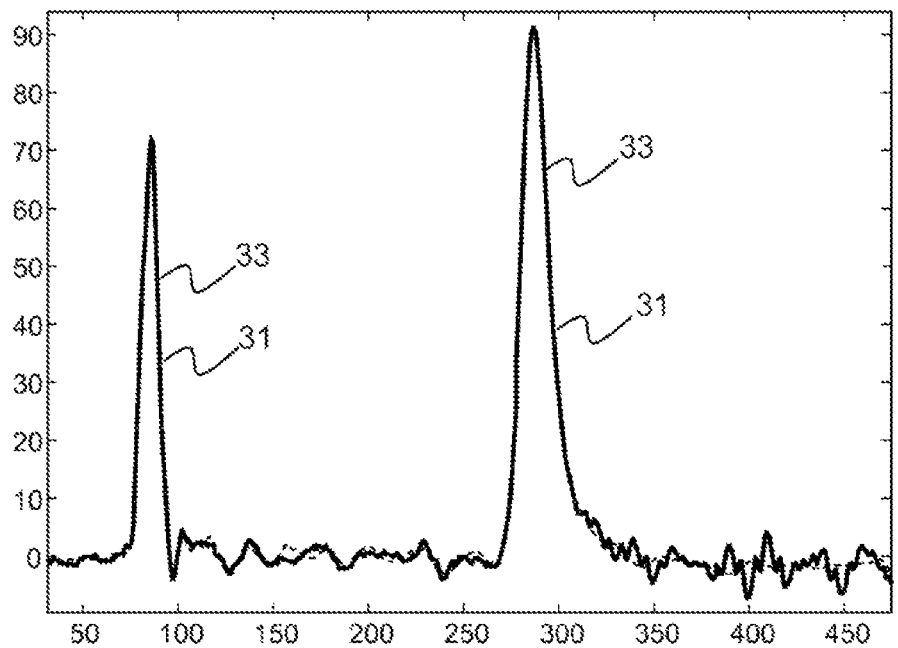

FIGS. 4a and 4b represent the estimated pulse responses $\hat{h}$ obtained respectively without and with the implementation of the method according to the invention. This is one example of application in which it is desired to diagnose a cable of the twisted pair type of length 10 meters while avoiding the 48 MHz to 92 MHz band which has been attenuated by 90% (in other words the corresponding coefficients $c_k$ within this band have been set to 0.1) and where the maximum frequency of the MCTDR signal was 200 MHz.

For these two figures:

The abscissa axis represents the samples from 0 to NP−1, a zoom having been carried out so as to focus on the interesting part of the reflectogram. It is possible to convert this axis into distance knowing the speed of propagation over the cable;

The ordinate axis represents the coefficient of reflection and is graduated in arbitrary units between −100% and +100%;

A first curve 31 represents the pulse response corresponding to an injected signal with no attenuated coefficients, in other words $F^{-1}\{X^*_{full}Y_{full}\}$.

In the FIG. 4a, a second curve 32 represents the estimated pulse response corresponding to an injected signal with the coefficients attenuated without compensation. This second curve 32 therefore represents the signal $F^{-1}\{X^*_{full}Y_{cancel}\}$;

In FIG. 4b, a third curve 33 represents the estimated pulse response corresponding to an injected signal with the coefficients attenuated with compensation, in other words with implementation of the method according to the invention. This second curve 32 therefore represents the signal $F^{-1}\{X^*_{full}\hat{Y}_{full}\}$.

In one variant embodiment of the invention, an injection signal may be used which is not of the MCTDR type. Indeed, it may be shown that the invention can advantageously be generalized by the use of a ratio $\xi$ defined by the following relationship, corresponding to a Tikhonov regularization:

$$\xi = \lim_{\varepsilon \to 0} \frac{X_{full}X^*_{cancel}}{|X_{cancel}|^2 + \varepsilon} \qquad (9)$$

The invention may therefore also be applied to signals such as pulses of any given width or else binary pulse sequences for example. In this case, in the relationship (8), $\varepsilon$ is chosen so as to avoid the conditioning problems. It is chosen to be arbitrarily small, and it is increased for as long as the calculation of spectral division of $\xi$ does not converge. This is indeed the same $\xi$ as that of the preceding fourth step 24.

The invention claimed is:

1. A method for diagnosing at least one electrical line by reflectometry measurements, said at least one electrical line being in use within a given frequency band, the diagnosis being carried out by analysis of a reflectogram of said at least one electrical line, wherein:

a complete injection signal having a digital spectrum formed from components weighted by a set of coefficients, in a preliminary step, the set of coefficients of the components included within said given frequency band are attenuated resulting in an incomplete digital spectrum being obtained;

in a next step, a complete analog signal composed from said incomplete digital spectrum is injected into the at least one electrical line;

in a next step, an echo corresponding to said injected analog signal is recovered by sampling measurements of said echo;

in a next step, a digital spectrum ($Y_{cancel}$) of said echo is calculated;

in a next step, a digital spectrum ($\hat{Y}_{full}$) of the echo of the complete analog signal, if the latter had been injected, is estimated, a $k^{th}$ component ($\hat{Y}_{fullk}$) of the estimated digital spectrum ($\hat{Y}_{full}$) being equal to a $k^{th}$ component ($Y_{cancelk}$) of the digital spectrum of the echo received multiplied by the ratio ($\xi_k$) between a $k^{th}$ component ($X_{fullk}$) of the digital spectrum of the complete injection signal over a $k^{th}$ component ($X_{cancelk}$) of the incomplete digital spectrum;

in a next step, the measurement of the reflectogram of said at least one electrical line is obtained based on the estimated digital spectrum ($\hat{Y}_{full}$).

2. The method as claimed in claim 1, wherein, the injected analog signal being calculated over N points, the echo is sampled over NP measurement points, the digital spectrum ($Y_{cancel}$) of the echo being calculated over said NP sampled points, P being strictly greater than 2.

3. The method as claimed in claim 2, wherein P is greater than or equal to 10.

4. The method as claimed in claim 2, wherein the ratio ($\xi_k$) are calculated over N points, the N calculated ratios being used P times.

5. The method as claimed in claim 1, wherein the injected analog signal is a signal of a multi-carrier time-domain reflectometry (MCTDR) type.

6. The method as claimed claim 1, wherein, the injected analog signal not being of an MCTDR type, said ratio ($\xi_k$) is defined according to the following relationship:

$$\xi = \lim_{\varepsilon \to 0} \frac{X_{full}X^*_{cancel}}{|X_{cancel}|^2 + \varepsilon}$$

$X_{full}$ and $X_{cancel}$ being respectively the digital spectrum of the complete injection signal and the digital spectrum of the injected analog signal.

7. A reflectometer device, designed to be used for diagnosing a line in use within a given frequency band, comprising at least:
- a parameterization block configured to configure parameters of a signal to be injected into said line, a complete injection signal having a digital spectrum formed from components weighted by a set of coefficients, the set of coefficients of the components included within said given frequency band being attenuated so as to obtain an incomplete digital spectrum;
- a block configured to synthesize the signal to be injected, in a digital domain, starting from said incomplete digital spectrum;
- a digital-analog converter configured to convert the synthesized digital signal into a complete analog signal;
- a coupling configured to couple to said line such that said complete analog signal is injected into said line;
- an analog-digital converter configured to convert an echo corresponding to the injected analog signal;
- a processor configured to:
  - carry out sampled measurements of said echo and to store the samples;
  - calculate a digital spectrum ($Y_{cancel}$) of said echo;
  - estimate a digital spectrum ($\hat{Y}_{full}$) of the echo of the complete analog signal, if the latter had been injected, a $k^{th}$ component ($\hat{Y}_{fullk}$) of the estimated digital spectrum ($\hat{Y}_{full}$) being equal to a $k^{th}$ component ($Y_{cancelk}$) of the digital spectrum of the echo received multiplied by a ratio ($\xi_k$) between a $k^{th}$ component ($X_{fullk}$) of the digital spectrum of the complete injection signal over a $k^{th}$ component ($X_{cancelk}$) of the incomplete digital spectrum;
  - obtain the reflectogram of said line based on the estimated digital spectrum ($\hat{Y}_{full}$).

8. The device as claimed in claim 7, wherein, the injected analog signal being calculated over N points, the echo is sampled over NP measurement points, the digital spectrum ($Y_{cancel}$) of the echo being calculated over said NP sampled points, P being strictly greater than 2.

9. The device as claimed in claim 8, wherein P is greater than or equal to 10.

10. The device as claimed in claim 8, wherein the ratio ($\xi_k$) are calculated over N points, the N calculated ratios being used P times.

11. The device as claimed in claim 8, wherein the injected analog signal is a signal of an MCTDR type.

12. The device as claimed in claim 8, wherein, the injected analog signal not being of an MCTDR type, said ratio ($\xi_k$) is defined according to the following relationship:

$$\xi = \lim_{\varepsilon \to 0} \frac{X_{full} X^*_{cancel}}{|X_{cancel}|^2 + \varepsilon}$$

$X_{full}$ and $X_{cancel}$ being respectively the digital spectrum of the complete injection signal and the digital spectrum of the injected analog signal.

* * * * *